US008884410B2

(12) United States Patent
Van De Water et al.

(10) Patent No.: US 8,884,410 B2
(45) Date of Patent: Nov. 11, 2014

(54) METHOD FOR MANUFACTURING A MICROELECTRONIC PACKAGE COMPRISING AT LEAST ONE MICROELECTRONIC DEVICE

(75) Inventors: Peter Wilhelmus Maria Van De Water, Nijmegen (NL); Paulus Martinus Catharina Hesen, Eindhoven (NL); Roelf Anco Jacob Groenhuis, Nijmegen (NL)

(73) Assignee: NXP B.V., Eindhoven (NL)

( * ) Notice: Subject to any disclaimer, the term of this patent is extended or adjusted under 35 U.S.C. 154(b) by 696 days.

(21) Appl. No.: 13/124,198

(22) PCT Filed: Oct. 16, 2009

(86) PCT No.: PCT/IB2009/054573
§ 371 (c)(1),
(2), (4) Date: Apr. 19, 2011

(87) PCT Pub. No.: WO2010/046825
PCT Pub. Date: Apr. 29, 2010

(65) Prior Publication Data
US 2011/0198738 A1 Aug. 18, 2011

(30) Foreign Application Priority Data

Oct. 20, 2008 (EP) ..................................... 08167014

(51) Int. Cl.
*H01L 23/495* (2006.01)
*H01L 23/31* (2006.01)
(Continued)

(52) U.S. Cl.
CPC . *H01L 23/49562* (2013.01); *H01L 2924/01033* (2013.01); *H01L 23/3135* (2013.01); *H01L*
(Continued)

(58) Field of Classification Search
CPC .... H01L 21/568; H01L 21/561; H01L 21/563
USPC ......................................................... 257/668
See application file for complete search history.

(56) References Cited

U.S. PATENT DOCUMENTS 7,285,849 B2 * 10/2007 Cruz et al. .................... 257/690
2006/0177967 A1 8/2006 Muto et al.
(Continued)

FOREIGN PATENT DOCUMENTS

| WO | 2007/067998 A2 | 6/2007 |
| WO | 2007/148782 A1 | 12/2007 |
| WO | 2010/046825 A1 | 4/2010 |

OTHER PUBLICATIONS

International Search Report and Written Opinion for Application PCT/IB2009/054573 (Feb. 24, 2010).

*Primary Examiner* — Phat X. Cao
*Assistant Examiner* — Diana C Vieira

(57) ABSTRACT

A method for manufacturing a microelectronic package (1) comprises the steps of providing at least two members (10, 11, 16) comprising electrically conductive material; providing a microelectronic device (15); placing the electrically conductive members (10, 11, 16) and the microelectronic device (15) in predetermined positions with respect to each other, and establishing electrical connections between each of the electrically conductive members (10, 11, 16) and the microelectronic device (15); and providing a non-conductive material for encapsulating the microelectronic device (15) and a portion of the electrically conductive members (10, 11, 16) connected thereto. The electrically conductive members (10, 11, 16) are intended to be used for realizing contact of the microelectronic device (15) arranged inside the package (1) to the external world. An important advantage of the method having steps as mentioned is that the electrically conductive members (10, 11, 16) as such are provided, wherein it is not necessary to provide a conventional lead frame which has the disadvantage of causing considerable waste of material during its manufacturing process.

2 Claims, 17 Drawing Sheets

(51) Int. Cl.
*H01L 23/00* (2006.01)
*H01L 21/56* (2006.01)

(52) U.S. Cl.
CPC ....... 2924/01006 (2013.01); *H01L 2924/01075* (2013.01); *H01L 2924/014* (2013.01); *H01L 2924/01029* (2013.01); *H01L 24/97* (2013.01); *H01L 2924/01082* (2013.01); *H01L 2924/01322* (2013.01); *H01L 2924/01079* (2013.01); *H01L 2924/12041* (2013.01); *H01L 21/561* (2013.01)
USPC .......................................... 257/666; 257/668

(56) References Cited

U.S. PATENT DOCUMENTS

| | | |
|---|---|---|
| 2006/0263988 A1* | 11/2006 | Takahashi et al. ............ 438/286 |
| 2007/0052070 A1 | 3/2007 | Islam et al. |
| 2007/0052078 A1 | 3/2007 | Kao |
| 2007/0114352 A1 | 5/2007 | Cruz et al. |
| 2008/0116580 A1 | 5/2008 | Jiang et al. |
| 2008/0224293 A1 | 9/2008 | Hin |
| 2009/0140411 A1 | 6/2009 | Masuda et al. |

* cited by examiner

METHOD FOR MANUFACTURING A MICROELECTRONIC PACKAGE COMPRISING AT LEAST ONE MICROELECTRONIC DEVICE

FIELD OF THE INVENTION

The present invention relates to a method for manufacturing a microelectronic package comprising at least one microelectronic device such as a processor chip, a transistor, a sensor die, a diode, a Light Emitting Diode (LED), etc., and also to a microelectronic package.

BACKGROUND OF THE INVENTION

Microelectronic packages in which at least one microelectronic device is arranged are well-known, and various types of such packages have been developed. Among other things, the packages serve for protecting the microelectronic device and allowing for easy electrical connection of the microelectronic device to another device. In general, dimensions of the microelectronic devices are in the micrometer range, and dimensions of the packages are in the millimeter range.

In general, for the purpose of supporting the microelectronic device and for ensuring that the microelectronic package has a required robustness, a carrier substrate is provided, wherein the microelectronic device is attached to the substrate. In a usual embodiment of the microelectronic package, a side of the carrier substrate where the microelectronic device is present is covered with material, wherein the microelectronic device is encapsulated in this material, whereas another side of the carrier substrate is freely accessible.

The carrier substrate is provided with electrically conductive tracks extending from the one side of the substrate to the other side of the substrate, in order to allow for electric contact from outside of the package to the microelectronic device. It is possible to have the electrically conductive tracks when a printed circuit board is provided, but in many cases, a metal lead frame, for example a copper lead frame, is provided for realizing these tracks. Such a lead frame is manufactured by providing a metal sheet, removing portions from this sheet and possibly bending this sheet in order to obtain a desired appearance of the lead frame. In practical cases, approximately ten times the sheet surface needed for forming the lead frame is thrown away when the lead frame is manufactured in this way.

SUMMARY OF THE INVENTION

It is an objective of the present invention to provide a method for manufacturing a microelectronic package comprising at least one microelectronic device which is different from the above-described method in which a metal lead frame is used, in such an advantageous way that less waste is produced and lower costs are involved. This objective is achieved by a method which comprises the following steps:
  providing at least two members comprising electrically conductive material;
  providing a microelectronic device;
  placing the electrically conductive members and the microelectronic device in predetermined positions with respect to each other, and establishing electrical connections between each of the electrically conductive members and the microelectronic device; and
  providing a non-conductive material for encapsulating the microelectronic device and a portion of the electrically conductive members connected thereto.

Many existing microelectronic devices are so-called semiconductor devices which require an application of three members for electrically contacting the device to the outside world. When such a microelectronic device is incorporated in a microelectronic package, and the method according to the present invention is applied, it is sufficient to provide only three separate electrically conductive members, to put these members and the microelectronic device in a correct position with respect to each other, and to establish electrical connections between each of the members and the microelectronic device. When these steps have been carried out, the package is closed, as it were, by applying encapsulating material, wherein the microelectronic device is completely covered by this material in order to protect the device from external influences, and wherein a portion of each electrically conductive member is left free so that the members are accessible for contact. In particular, in many cases, it is required to connect one member, which is often referred to as collector member to one side of the microelectronic device, and to connect the other two members, which are often referred to as base member and emitter member, to another side of the microelectronic device.

When the method according to the present invention is applied, manufacturing a microelectronic package does not require manufacturing a lead frame. Instead, it is sufficient to only provide a number of electrically conductive members for the purpose of realizing a required number and type of members for allowing for electrically contacting the microelectronic device of the package from the outside, wherein there is no need for removal of material, as a shape and a size of the electrically conductive members may easily be adapted to the application of these members in the microelectronic package.

According to the present invention, a lead frame is not required for the purpose of providing a package with a required robustness. As soon as the encapsulating material has been applied and has solidified, the positions of the microelectronic package and the electrically conductive members are fixed, wherein the presence of the encapsulating material is sufficient for obtaining a required robustness.

The electrically conductive members may be strip sections or wire sections, for example, whether comprising an electrically insulating outer layer, or not, wherein a cross-section of the members may have any suitable shape, and may for example be rectangular. When the method according to the present invention is applied, a cost price of the microelectronic package is dramatically reduced, as only necessary components of the package are provided, wherein there is no need to apply a conventional process of manufacturing a lead frame by providing a sheet of material and removing portions of this sheet. For example, the electrically conductive members may comprise copper strip sections or wire sections, and the encapsulating material may be an epoxy material.

In a practical way of carrying out the method according to the present invention, the microelectronic device is placed on at least one electrically conductive member and is connected to this electrically conductive member prior to providing at least one other electrically conductive member, placing the other electrically conductive member in a predetermined position with respect to the assembly of the at least one electrically conductive member and the microelectronic device which has already been formed, and establishing a connection between the microelectronic device and the other electrically conductive member. In this way, it is very well possible to manufacture the microelectronic package in a prescribed way and with a prescribed accuracy, also in case it is required to connect electrically conductive members to opposite sides of the microelectronic device.

Advantageously, a configuration of at least one electrically conductive member in which two portions of the electrically conductive member are extending at different levels is realized by bending the electrically conductive member. An advantage of the obtained configuration of the electrically conductive member is that it is easy to incorporate the member in a microelectronic package in which only a portion of the member is intended to be exposed at an outside of the package. The microelectronic device may be positioned between the levels at which the portions of this member are extending. In such a case, the microelectronic package may have a very compact design, as the application of the microelectronic device does not contribute to the height of the microelectronic package, provided that a difference between the levels at which the portions of the electrically conductive member are extending is at least equal to a height of the microelectronic device. Furthermore, it is noted that this concept can be applied for both planar and non-planar semiconductor devices.

According to the present invention, a method for manufacturing a microelectronic package, which is suitable to be applied for the purpose of mass production of microelectronic packages, comprises the following steps:

manufacturing an array of microelectronic packages by providing a plurality of members comprising electrically conductive material; providing microelectronic devices, forming assemblies of at least one electrically conductive member and a microelectronic device by placing the microelectronic device in a predetermined position with respect to the electrically conductive member, and establishing an electrical connection between the microelectronic device and the electrically conductive member; providing a plurality of electrically conductive members, placing at least one electrically conductive member in a predetermined position with respect to each one of the assemblies of at least one electrically conductive member and a microelectronic device which have already been formed, and establishing electrical connections between the electrically conductive members and the microelectronic devices; and providing a non-conductive material for encapsulating the microelectronic devices and a portion of the electrically conductive members connected thereto; and dividing the array of microelectronic packages into individual microelectronic packages.

Advantageously, a carrier is used for the purpose of supporting at least the electrically conductive members to which the microelectronic devices are first connected. By doing so, keeping the various components of a microelectronic package in the process of formation in a right mutual position when electrical connections between these components are established and encapsulating material is applied may be facilitated. By using a carrier, both handling and positioning of the electrically conductive members may be facilitated, wherein it is very well possible to keep these members in a desired configuration.

According to a feasible option, the carrier may comprise a caterpillar track having a supporting surface which is provided with a plurality of grooves which are adapted to receive at least a portion of the electrically conductive members. When the electrically conductive members comprise at least two portions extending at different levels, it is preferred if a depth of the grooves is practically equal to a difference between the levels at which the portions are extending, so that both portions may be supported, and a steady position of the members on the carrier is obtained.

Preferably, a caterpillar track which is shaped as a closed loop and which is supported by at least two wheels is used, wherein at least one of the wheels is driven such as to rotate and make the track move, wherein each microelectronic package is assembled on a portion of the track which is moving between the two wheels, and wherein each microelectronic package is removed from the track when the portion of the track reaches one of the wheels and is made to follow a circumference of this wheel. An advantage of doing so is that the grooves of the caterpillar may be used to loosely hold at least one component of the microelectronic package throughout the process of manufacturing the microelectronic package, and that it is still easy to remove the microelectronic packages from the track in view of the fact that the grooves open up to some extent when the track is bent in the process of following one of the wheels.

Within the scope of the present invention, providing a plurality of electrically conductive members may involve providing at least one electrically conductive member having an elongated appearance, wherein a length of the elongated electrically conductive member is larger than a predetermined length of an individual electrically conductive member. In such a case, various individual members are adjacent in a longitudinal direction of the elongated member, wherein applying the electrically conductive devices involves connecting a number of these devices to the elongated member. In a situation in which microelectronic packages having only one microelectronic device is manufactured, a distance between the devices is chosen such that each of the devices is associated with another individual member. In any case, by applying an elongated member which is in fact a collection of members instead of separate members, it is easier to perform the manufacturing process, as it is easier to handle one member and to put this member in the right place than to handle various members and put each of these members in the right place. Consequently, using the elongated member may also contribute to the accuracy. In any case, when the elongated member is used, the various individual members are automatically separated at the end of the manufacturing process when the array of microelectronic packages is divided into individual microelectronic packages.

In a practical way of carrying out the method in which the above-described elongated member is used, a number of electrically conductive members having an elongated appearance is provided, wherein the members are positioned substantially parallel to each other, at predetermined mutual distances, and wherein at least one other electrically conductive member having an elongated appearance, which is provided after the microelectronic devices have been provided and connected to the first number of electrically conductive members, is put in a position for crossing the first number of electrically conductive members and interconnecting microelectronic devices arranged on these members. In this way, it is possible to build a relatively strong construction of microelectronic packages comprising a number of cross-linked elongated members, which is only divided in small pieces after all other steps of manufacturing the microelectronic packages have taken place, on the basis of which handling of the array of microelectronic packages may be facilitated and the accuracy may be enhanced.

According to the present invention, in an alternative way of carrying out the method for manufacturing a microelectronic package, the electrically conductive members are put in a configuration in which a space for receiving the electronic device is present between end portions of the electrically conductive members, wherein the microelectronic device is inserted in this space. In this way, it is possible to provide all electrically conductive members at once, wherein all that is further needed to manufacture the microelectronic package is putting the microelectronic device in the right place between end portions of the members, establishing the required connections between the microelectronic device and the members, and applying the encapsulating material. In the process of putting the microelectronic device in place, the end portions of the electrically conductive members may serve as a kind of guiding elements, so that the positioning process of the microelectronic device may be performed easily and accurately.

Preferably, the electrically conductive members are held together in a carrier comprising non-conductive material, wherein the electrically conductive members are extending through this carrier. Using the carrier is an easy way of putting and keeping the electrically conductive members in required mutual positions. The carrier may simply become part of the microelectronic package, but it is also possible to remove the carrier after the microelectronic device has been provided and connected to the electrically conductive members, if so desired.

When the alternative method is applied for the purpose of mass production of microelectronic packages, the method preferably comprises the following steps:

manufacturing an array of microelectronic packages by providing a carrier and an array of sets of members comprising electrically conductive material, wherein the electrically conductive members are extending through this carrier, and wherein a configuration of the electrically conductive members of each set is adapted to having a space for receiving a microelectronic device between end portions of the electrically conductive members; providing microelectronic devices, inserting a microelectronic device in the space of each set, and establishing electrical connections between the microelectronic devices and the electrically conductive members; and providing a non-conductive material for encapsulating the microelectronic devices and a portion of the electrically conductive members connected thereto, wherein this material is applied on the carrier through which the electrically conductive members are extending; and dividing the array of microelectronic packages into individual microelectronic packages.

The application of a single carrier for holding the electrically conductive members of various sets of members offers many practical advantages. Among other things, handling of the electrically conductive members is facilitated, and it is possible to separate the steps of providing the electrically conductive members and providing the microelectronic devices, if so desired, as the carrier having the electrically conductive members may be manufactured as an intermediate product.

The present invention also relates to a microelectronic package, namely a microelectronic package comprising only the following components as functional components:

at least one microelectronic device;

at least two members comprising electrically conductive material for enabling the microelectronic device to be electrically contacted from outside of the package; and a quantity of electrically insulating material in which the microelectronic device and a portion of the electrically conductive members are encapsulated.

In comparison with known conventional microelectronic packages comprising an encapsulated element which only serves for supporting components of the package, the microelectronic package according to the present invention may be smaller due to the fact that such an element is absent. Furthermore, the manufacturing process of the microelectronic package according to the present invention is significantly cheaper, due to, among other things, the fact that there is no need for wasting any material, while the functionality is the same.

The above-described and other aspects of the present invention will be apparent from and elucidated with reference to the following description of a number of ways of carrying out a method for manufacturing a microelectronic package according to the present invention, as well as of a number of microelectronic packages which are obtained as a result of the various manufacturing processes.

BRIEF DESCRIPTION OF THE DRAWINGS

The present invention will now be explained in greater detail with reference to the Figures, in which equal or similar parts are indicated by the same reference signs, and in which.

DETAILED DESCRIPTION OF EMBODIMENTS

Figure 7:
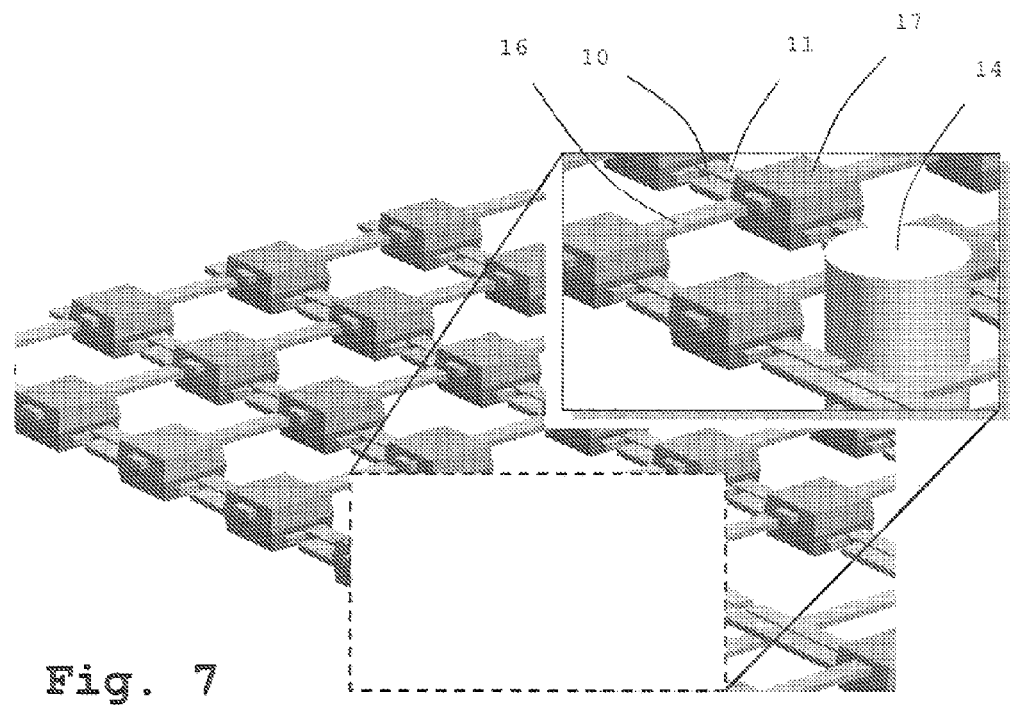
Figure 8:
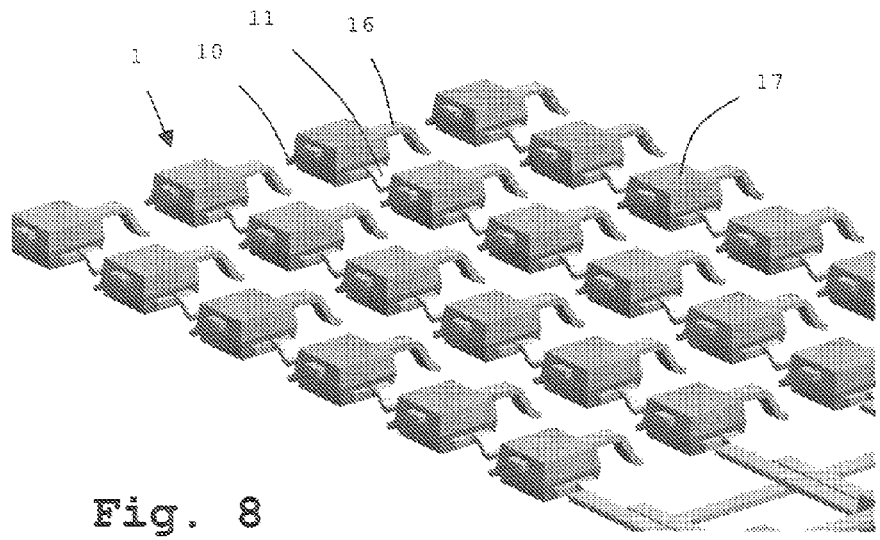
Figure 9:
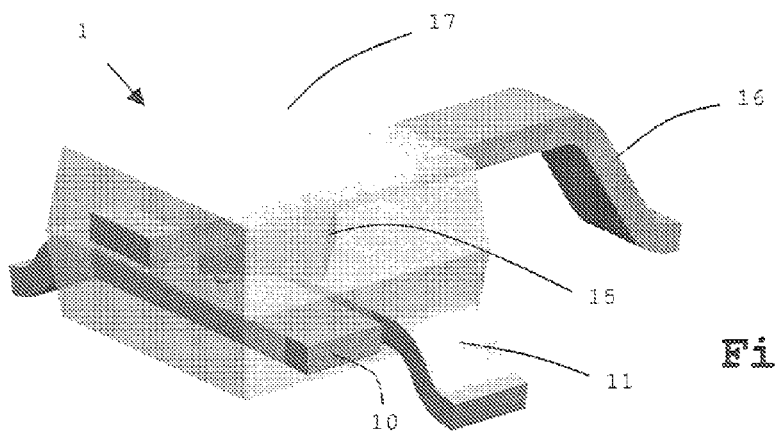
FIGS. 9 and 10 diagrammatically show two different views of a microelectronic package which is realized by performing the first manufacturing process, wherein, for sake of clarity, an encapsulating member of the package is shown as being transparent.
Figure 10:
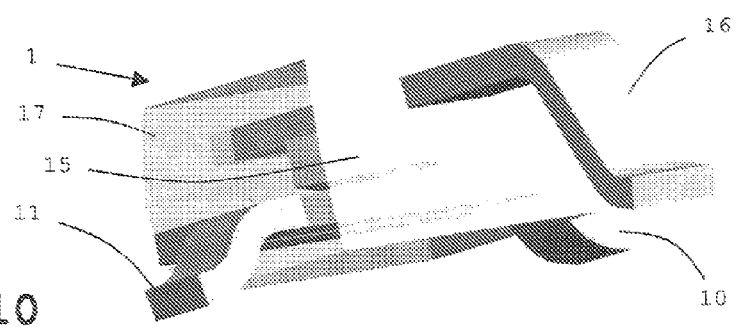

FIGS. 1-8 illustrate successive steps of a first process of manufacturing a microelectronic package 1 according to the present invention, which is shown in FIGS. 9 and 10.

Figure 1:
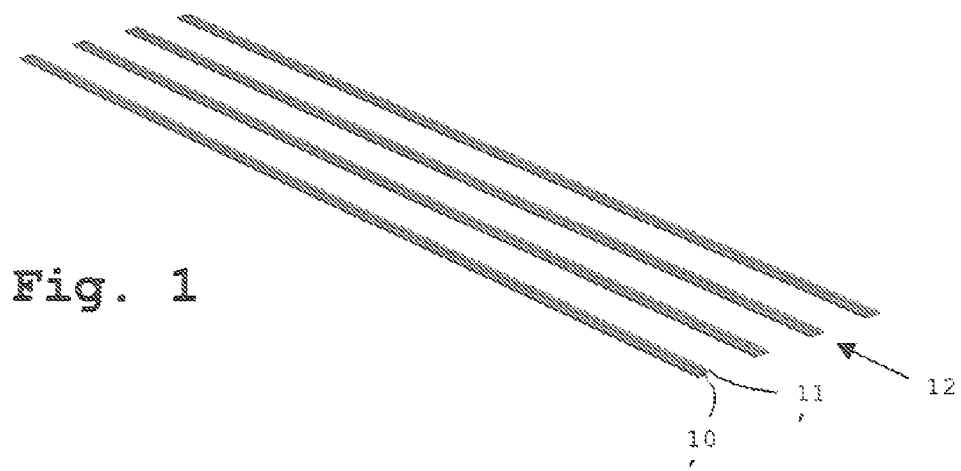
FIGS. 1-8 illustrate successive steps of a first process of manufacturing a microelectronic package according to the present invention.

In a first step of the first manufacturing process, which is illustrated in FIG. 1, a number of electrically conductive wires 10', 11' is provided, wherein the wires 10', 11' are positioned substantially parallel to each other. Distances between the wires 10', 11' are chosen such that sets 12 of two wires 10', 11' being positioned relatively close to each other are realized, wherein a distance between two successive sets 12 of wires 10', 11' is significantly larger than a distance between two wires 10', 11' forming a set 12. The wires 10', 11' may be metal wires, and the wires 10', 11' may comprise an electrically insulating outer layer, but this is not necessary. If an electrically insulating outer layer is present, at least a portion of this layer should be removed at some stage during the manufacturing process in order to allow for electric contact of the wires to other components.

In the following, for sake of clarity, one of the wires 10', 11' of a set 12 of wires 10', 11' will be referred to as base wire 10', and another of the wires 10', 11' of a set 12 of wires 10', 11' will be referred to as emitter wire 11'.

Figure 2:
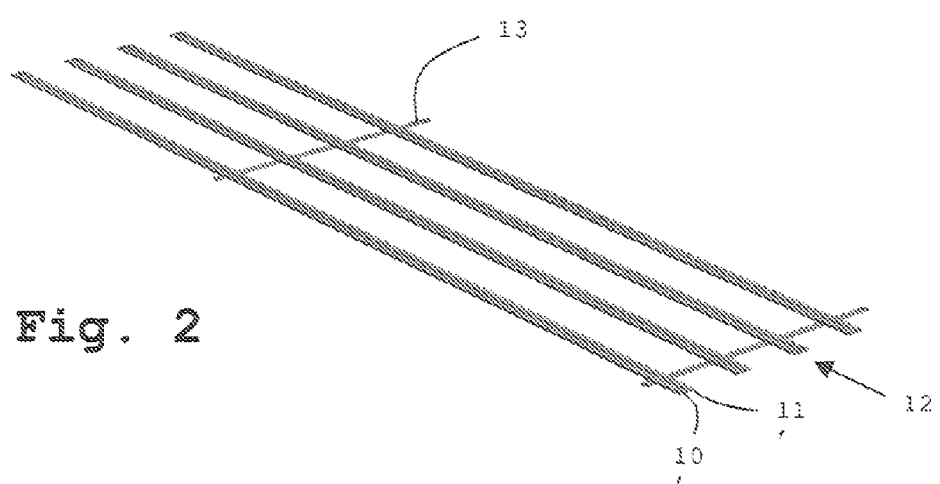
Figure 3:
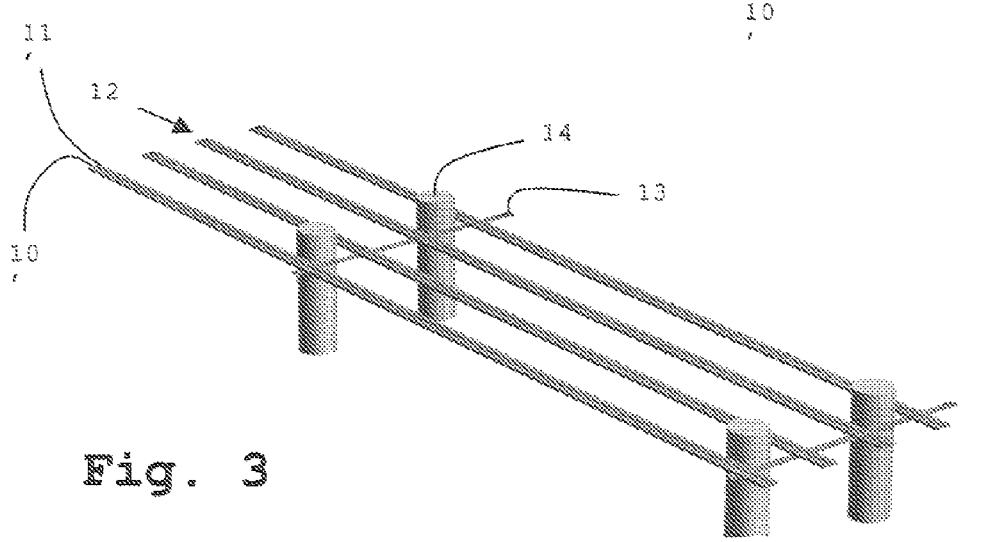

In a second step of the first manufacturing process, which is illustrated in FIG. 2, a number of connection wires 13 is provided, wherein the connection wires 13 are positioned such as to cross the various sets 12 of base wires 10' and emitter wires 11'. Furthermore, the connection wires 13 are connected to the other wires 10', 11', wherein a suitable connecting technique such as (laser) spot welding is applied.

Preferably, the various connection wires 13 are positioned at a fixed mutual distance, so that easy handling of the obtained assembly of base wires 10', emitter wires 11' and connection wires 13 is possible. This is apparent from FIG. 3 in which pairs of conventional index pins 14 are shown. These index pins 14 are part of equipment (not shown) for handling the microelectronic packages in the process of formation, are movable in a longitudinal direction of the base wires 10' and the emitter wires 11', and are suitable to be used for displacing the assembly in this direction by contacting the connection wires 13. Assuming that the pairs of index pins 14 are arranged at a fixed mutual distance, it is practical if the connection wires 13 are positioned at a fixed mutual distance as well, wherein the mutual distances are practically equal. It is noted that the connection wires 13 are provided for the purpose of allowing the index pins 14 to engage the microelectronic packages in the process of formation, and are not intended to be part of the microelectronic packages 1 to be manufactured.

It is noted that, for sake of clarity, only a section of the base wires 10' and the emitter wires 11' is shown in the Figures, and that therefore, only two connection wires 13 are shown. However, in practical applications of the method according to the present invention, these wires 10', 11' may be much longer, and many more connection wires 13 may be connected to these wires 10', 11'.

Figure 4:
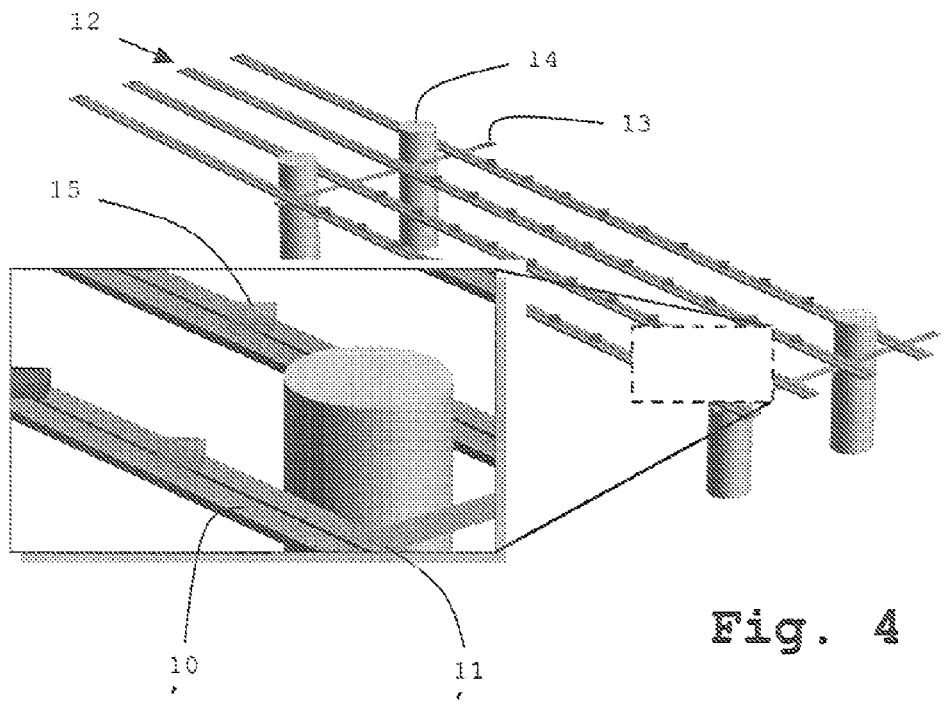

In a third step of the first manufacturing process, which is illustrated in FIG. 4, a number of microelectronic devices 15 is provided, wherein electrical connections are established between each microelectronic device 15 and both the base wire 10' and the emitter wire 11' of a set 12 of wires 10', 11'. In the shown example, one set 12 of wires 10', 11' serves for realizing a plurality of microelectronic packages 1, wherein each package 1 comprises one microelectronic device 15. Therefore, a number of microelectronic devices 15 is connected to each set 12 of wires 10', 11', wherein the microelectronic devices 15 are positioned at a predetermined mutual distance in the longitudinal direction of the wires 10', 11'.

Within the scope of the present invention, the microelectronic devices 15 may be of any suitable type. For example, these devices 15 may comprise processor chips, transistors, sensor dies, diodes, LEDs, etc. In the following, the microelectronic devices 15 will be referred to as dies 15. In the shown example, each of the dies 15 comprises three contact areas, wherein two contact areas are arranged at a side of the die 15 which, for sake of clarity, will be referred to as top side of the die 15, and wherein one contact area is arranged at a side of the die 15 which, for sake of clarity, will be referred to as bottom side of the die 15. The connection of the die 15 to the base wires 10 and the emitter wires 11 is at the top side of the die 15, i.e. the side where two contact areas are located.

Establishing a connection between each of the dies 15 and the wires 10', 11' may take place in any suitable way. For example, the dies 15 may be provided with solder balls and a wafer-back coating, wherein the dies 15 are bonded onto the wires 10', 11' with a thermo-compression process, or the dies 15 may be provided with gold studs, wherein the dies 15 are bonded onto the wires 10', 11' through eutectic bonding. In any case, the shown way of establishing the required connection is also known to a person skilled in the art as flip chip assembly.

Figure 5:
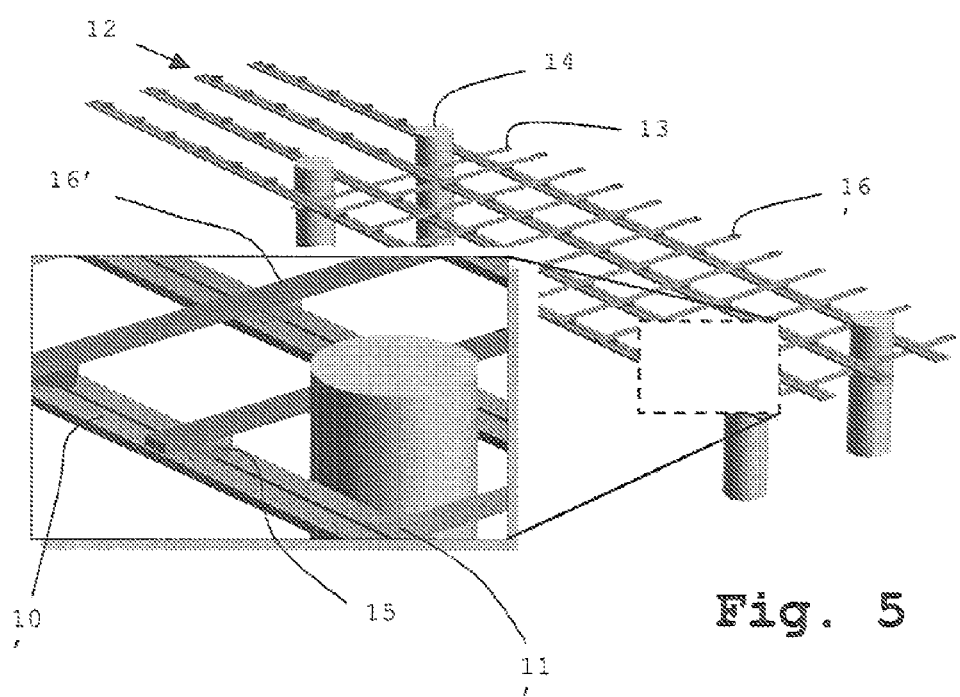

In a fourth step of the first manufacturing process, which is illustrated in FIG. 5, a number of wires 16' is provided, wherein the wires 16' are oriented such as to cross the various sets 12 of base wires 10' and emitter wires 11'. Furthermore, the wires 16' are connected to the bottom side of dies 15 of the various sets 12 of wires 10', 11', wherein a suitable connecting technique such as applying and activating an adhesive is applied. In the following, the wires 16' which are provided in the fourth step are referred to as collector wires 16'.

Figure 6:
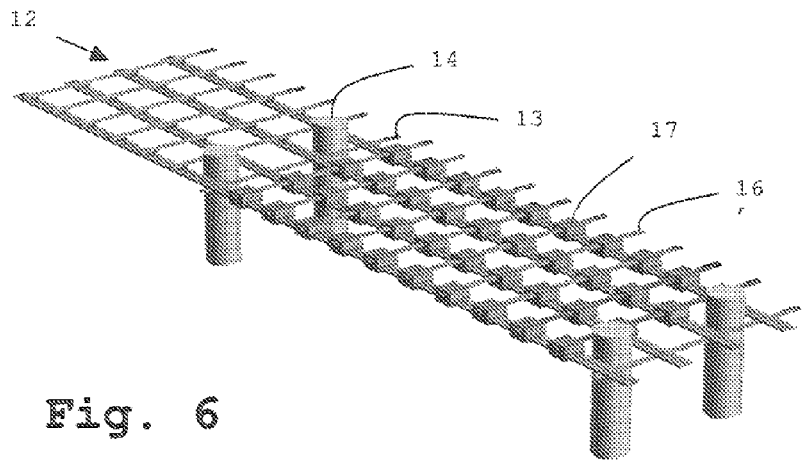

In a fifth step of the first manufacturing process, which is illustrated in FIG. 6, electrically insulating material is applied for the purpose of forming encapsulating members 17, wherein each encapsulating member 17 serves for accommodating a die 15 and portions of the base wire 10', the emitter wire 11' and the collector wire 16' connected to the die 15. The encapsulating members 17 may be made of any suitable material, for example an epoxy material, which may be applied in any suitable way, for example by carrying out a conventional cavity transfer molding process, in which molds having defined cavities are used, wherein material for forming the encapsulating member 17 is supplied to the cavities in a fluid state, and is subsequently allowed to solidify.

In a sixth step of the manufacturing process, assuming that the base wires 10', the emitter wires 11' and the collector wires 16' are metal (copper) wires which are not covered by any electrically insulating layer or the like, the portions of these wires 10', 11', 16' which are not covered by an encapsulating member 17 are plated galvanically or are treated in any other suitable way for preparing them for a practical application of the microelectronic packages 1 to be manufactured.

In a seventh step of the first manufacturing process, which is illustrated in FIG. 7, the base wires 10', the emitter wires 11' and the collector wires 16' are cut in sections 10, 11, 16, such that individual units comprising one die 15 and one encapsulating member 17 are isolated, wherein any suitable separating technique may be applied.

In an eighth step of the first manufacturing process, which is illustrated in FIG. 8, the portions of the wire sections 10, 11, 16 which are extending outside of the encapsulating member 17 are bent such as to allow for connection at a single level by putting ends of the wire sections 10, 11, 16 in a single imaginary plane. After the eighth step of the first manufacturing process has been performed, the first microelectronic package 1 as shown in FIGS. 9 and 10 is ready. Depending on the type of die 15, the microelectronic package 1 may have various applications. For example, the microelectronic package 1 may be formed such as to function as a transistor.

An important advantage of the above-described way of manufacturing microelectronic packages 1 is that members 10, 11, 16 which are arranged for the purpose of allowing for proper electric contact between the encapsulated die 15 and another device (not shown) such as a printed circuit board, and which are often referred to as leads 10, 11, 16, are obtained on the basis of the various wires 10', 11', 16'. In this way, it is achieved that realizing the leads 10, 11, 16 does not involve a production of waste of electrically conductive material, which may be copper or another metal. Providing electrically conductive wire sections 10, 11, 16 and electrically insulating material for supporting the wire sections 10, 11, 16 and keeping the wire sections 10, 11, 16 in predetermined mutual positions by encapsulating portions of the wire sections 10, 11, 16 is a cheap alternative to the conventional processes of manufacturing a lead frame, during which a metal sheet is provided and portions of this sheet are removed.

Another important advantage of the above-described way of manufacturing microelectronic packages 1 is that each of the wire sections 10, 11, 16 is directly connected to the proper side of the die 15, and that the wire sections 10, 11, 16 may subsequently be bent in case it is desired to have free ends of the wire sections 10, 11, 16 at a single level, as in this way, there is no need for applying a more complicated method for establishing connections between the die 15 and the wire sections 10, 11, 16, in particular a method known as wire bonding.

Preferably, the various steps of the above-described first process of manufacturing a microelectronic package 1 are simultaneously performed at different positions in the longitudinal direction of the base wires 10' and the emitter wires 11'. By means of the index pins 14 or other suitable means, the assembly of base wires 10', emitter wires 11' and connection wires 13 is displaced in discrete steps, wherein successive steps are performed in successive portions of the total length of the base wires 10' and the emitter wires 11'. For example, the successive portions may be portions extending between two successive connection wires 13. On the basis of this way of manufacturing the microelectronic packages 1 in mass production, it is possible to apply a production line (now shown) having various stations for performing the various steps, wherein the stations are disposed in a line, and wherein portions of the assembly of base wires 10', emitter wires 11' and connection wires 13 are moved from one station to another by displacing the complete assembly with respect to the stations. In principe, it is also possible that a relative movement of the assembly and the stations is obtained by displacing the stations and keeping the assembly in place, although this is less practical.

Furthermore, it is possible that the base wires 10' and the emitter wires 11' are wound off of reels (not shown) or the like, so that a continuous supply of these wires 10', 11' is guaranteed.

Figure 13:
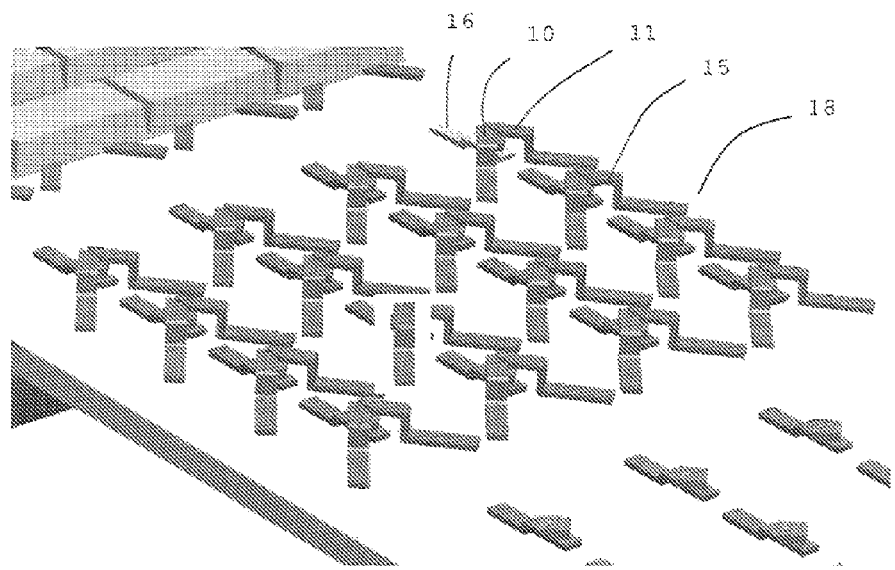
Figure 14:
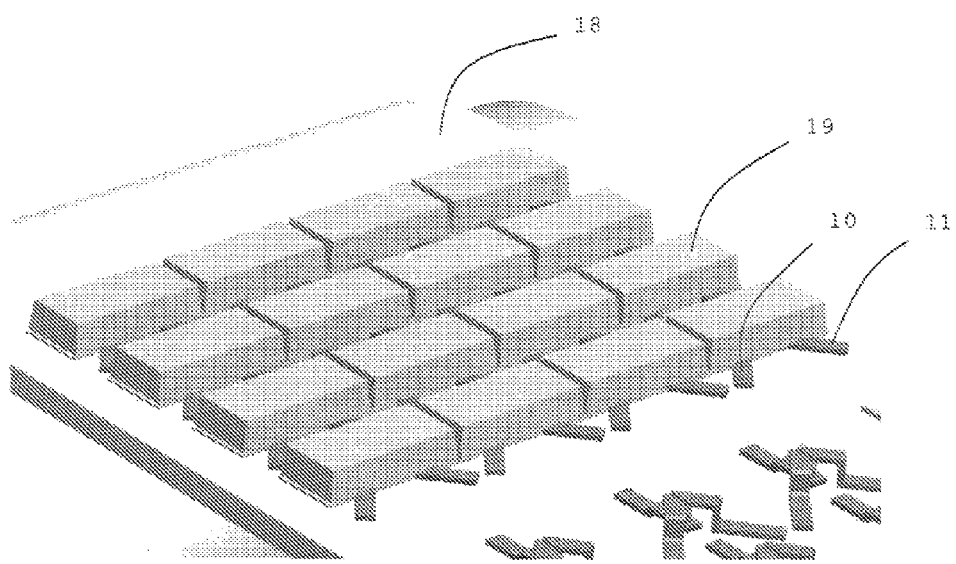
Figure 15:
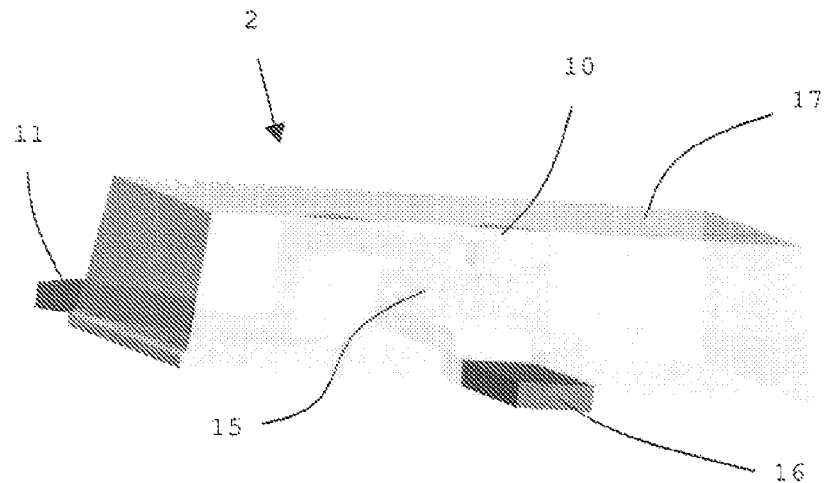
FIGS. 15 and 16 diagrammatically show two different views of a microelectronic package which is realized by performing the second manufacturing process, wherein, for sake of clarity, an encapsulating member of the package is shown as being transparent.
Figure 16:
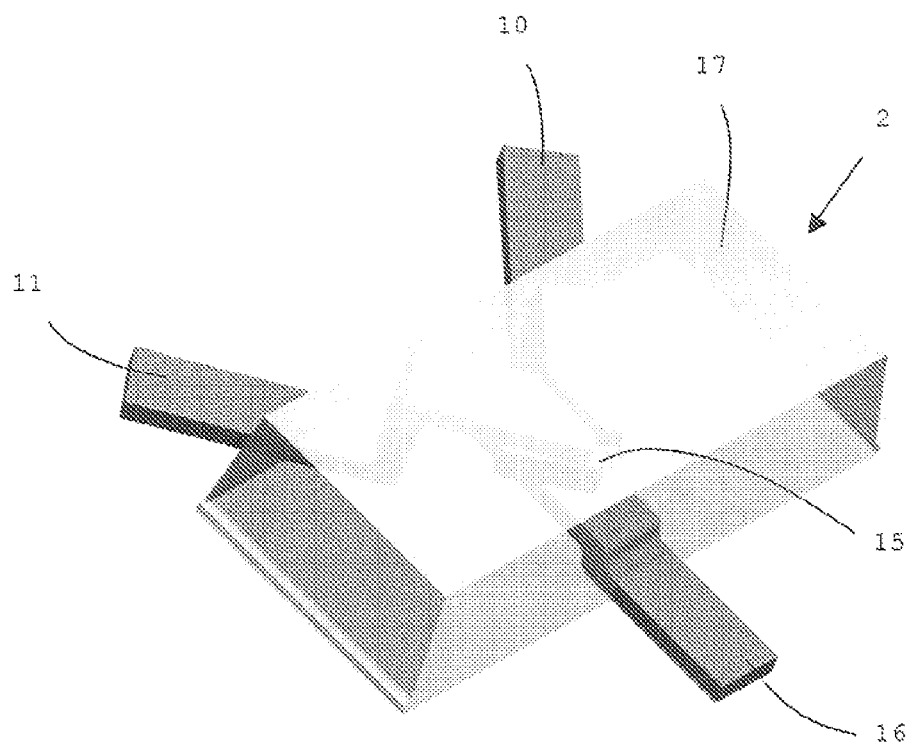

FIGS. 11-14 illustrate successive steps of a second process of manufacturing a microelectronic package 2 according to the present invention, which is shown in FIGS. 15 and 16. Like the first microelectronic package 1, the second microelectronic package 2 also is constituted of a base lead 10, an emitter lead 11 and a collector lead 16, a die 15 and an encapsulating member 17.

Figure 11:
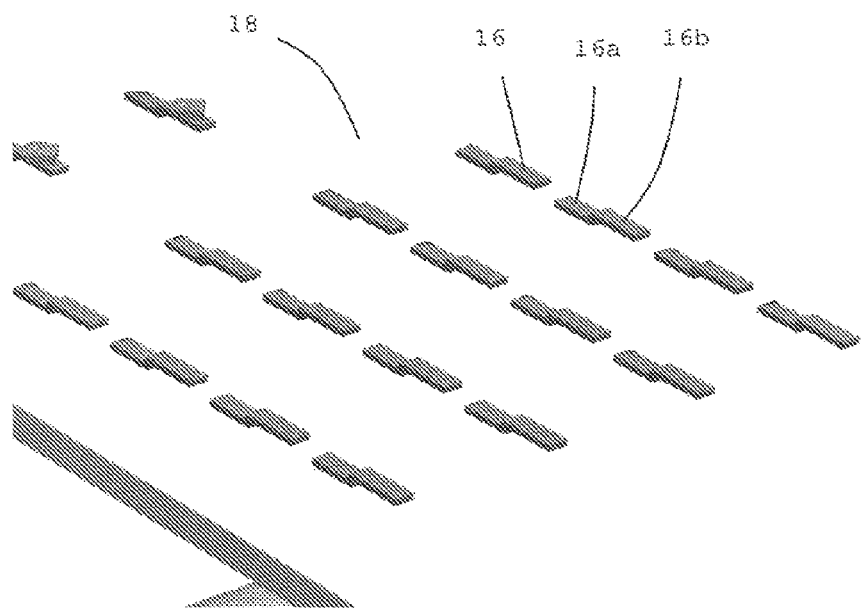
FIGS. 11-14 illustrate successive steps of a second process of manufacturing a microelectronic package according to the present invention, wherein a carrier is applied for supporting components of the microelectronic package.

In a first step of the second manufacturing process, which is illustrated in FIG. 11, a number of electrically conductive strip sections 16 which serve for forming the collector leads 16 of the microelectronic package 2 to be manufactured is provided. For example, the collector strip sections 16 may be bare copper or iron strip sections with pre-plated palladium. The collector strip sections 16 are bent, wherein two portions 16a, 16b of the strip sections 16 extending at different levels are obtained. The collector strip sections 16 are placed on a carrier tape 18 which is adapted to support and hold the collector strip sections 16, wherein a portion 16a of the strip sections 16 which will hereinafter be referred to as lower portion 16a is in contact with the carrier tape 18.

Figure 12:
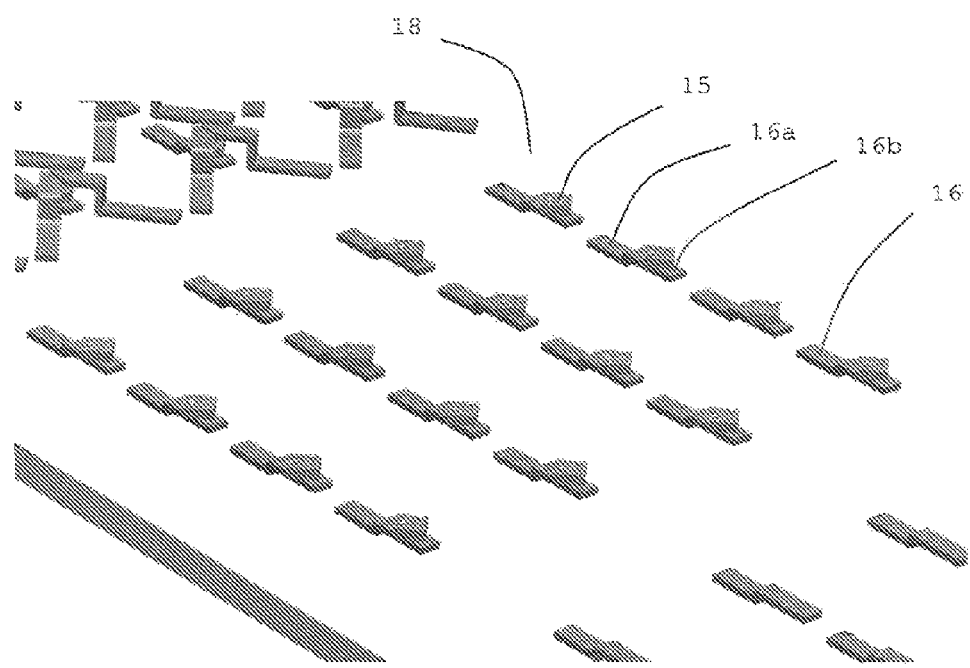

In a second step of the second manufacturing process, which is illustrated in FIG. 12, a number of dies 15 is provided, wherein the bottom side of a die 15 is connected to an upper portion 16b of each collector strip section 16.

In a third step of the second manufacturing process, which is illustrated in FIG. 13, a number of electrically conductive strip sections 10, 11 which serve for forming the base leads 10 and the emitter leads 11 of the microelectronic package 2 to be manufactured is provided. Two strip sections 10, 11 are connected to each assembly of a collector strip section 16 and a die 15, wherein the strip sections 10, 11 are connected to the top side of the die 15.

In respect of the connections which are established in the second step and the third step, it is noted that these connections may be established in any suitable way, as has already been noted, wherein techniques like wafer back coating and eutectic bonding may be applied.

In a fourth step of the second manufacturing process, which is illustrated in FIG. 14, electrically insulating material is applied for the purpose of forming encapsulating members 17, wherein each encapsulating member 17 serves for accommodating a die 15 and portions of the base strip section 10, the emitter strip section 11 and the collector strip section 16 connected to the die 15. The encapsulating members 17 may be made of any suitable material, for example an epoxy material, which may be applied in any suitable way, for example by carrying out a conventional solid bar molding process, in which a number of encapsulating members 17 are formed as portions of a single bar 19, wherein the encapsulating members 17 may only be connected through a relatively small portion of material, so that it is easy to break the bar 19 in order to obtain individual members 17. The formation of a bar 19 of encapsulating material is shown in FIG. 14.

A fifth step of the second manufacturing process involves breaking the bar 19 and thereby obtaining individual microelectronic packages 2 as shown in FIGS. 15 and 16. In the shown example, like the collector strip section 16, the base strip section 10 and the emitter strip section 11 are bent such as to have two portions extending at different levels, wherein a step of bending external portions of the strip sections 10, 11, 16 after the encapsulating member 17 has been formed does not need to be performed, as it is possible to have the applied strip sections 10, 11, 16 configured in such a way that their free ends are in a single imaginary plane or in any other desired mutual position.

Within the scope of the present invention, it is not necessary to form bars 19 of encapsulating material, and it is just as well possible to form individual encapsulating members 17. However, the formation of a bar 19 has some advantages, including the fact that a whole of a number of microelectronic packages 2 interconnected by a bar 19 of material is easier to handle than individual packages 2. For example, testing of the functioning of the microelectronic packages 2 may be performed when the packages 2 are still interconnected through the bar 19.

Preferably, the various steps of the above-described second process of manufacturing a microelectronic package 2 are simultaneously performed on batches comprising a predetermined number of microelectronic packages 2 in the process of formation at different positions in the longitudinal direction of the carrier tape 18, which may be movably arranged with respect to a number of stations adapted to perform the steps.

It is noted that an adhesive may be applied to the carrier tape 18 in order to enable the carrier tape 18 to keep the various components of the microelectronic package 2 in a proper position.

Figure 17:
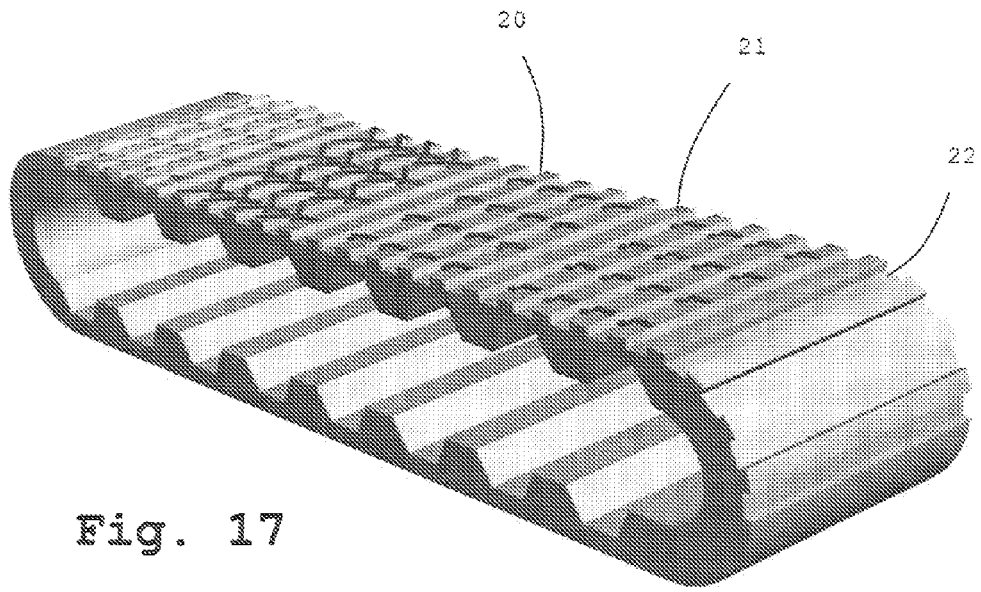
FIG. 17 diagrammatically shows an alternative carrier which is suitable to be used in a third process of manufacturing a microelectronic package according to the present invention.

FIG. 17 shows an alternative carrier 20 which is suitable to be used in a third process of manufacturing a microelectronic package 3 according to the present invention. In particular, this carrier comprises a movably arranged caterpillar track 20 having a supporting surface 21 which is provided with a plurality of grooves 22 extending substantially perpendicular to a direction of movement of the track 20. The shown caterpillar track 20 is shaped as a closed loop and is intended to be supported by two wheels (not shown) and to be driven by means of at least one of these wheels. The manufacturing process of the microelectronic packages 3 takes place at a portion of the caterpillar track 20 when this portion is up, and the obtained microelectronic packages 3 are removed from the track 20 when the track portion supporting the packages 3 reaches one of the wheels, as will be further explained in the following.

Figure 18:
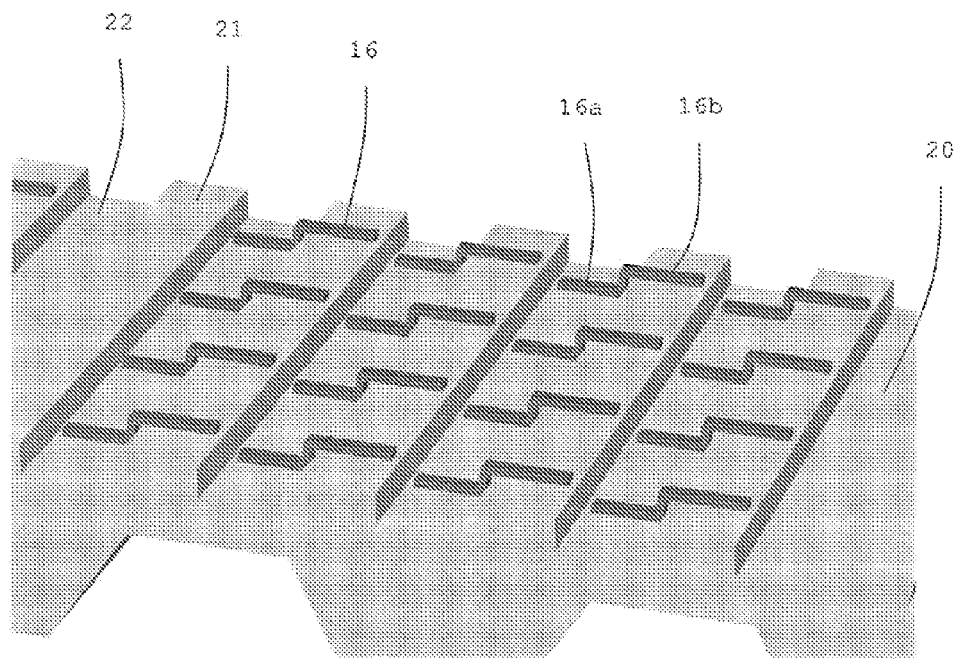
FIGS. 18-24 illustrate successive steps of the third process of manufacturing a microelectronic package according to the present invention, wherein the carrier shown in FIG. 17 is applied for supporting components of the microelectronic package.

In a first step of the third manufacturing process, which is illustrated in FIG. 18, a number of electrically conductive strip sections 16 which serve for forming the collector leads 16 of the microelectronic package 3 to be manufactured is provided. For example, the collector strip sections 16 may be bare copper or iron strip sections with pre-plated palladium. The collector strip sections 16 are bent, wherein two portions 16a, 16b of the strip sections 16 extending at different levels are obtained. The collector strip sections 16 are placed on the caterpillar track 20, wherein a lower portion 16a of the strip sections 16 is placed in the grooves 22 of the track 20. Preferably, a depth of the grooves 22 is practically equal to a height difference between the portions 16a, 16b of the strip section 16, so that an upper portion 16b of the strip sections 16 is supported by the supporting surface 21 which is present between the grooves 22. In the shown example, four collector strip sections 16 are placed in one groove 22, so that a row of four microelectronic packages 3 may be manufactured in one groove 22. For sake of completeness, it is noted that the number of four is not essential within the scope of the present invention.

Figure 19:
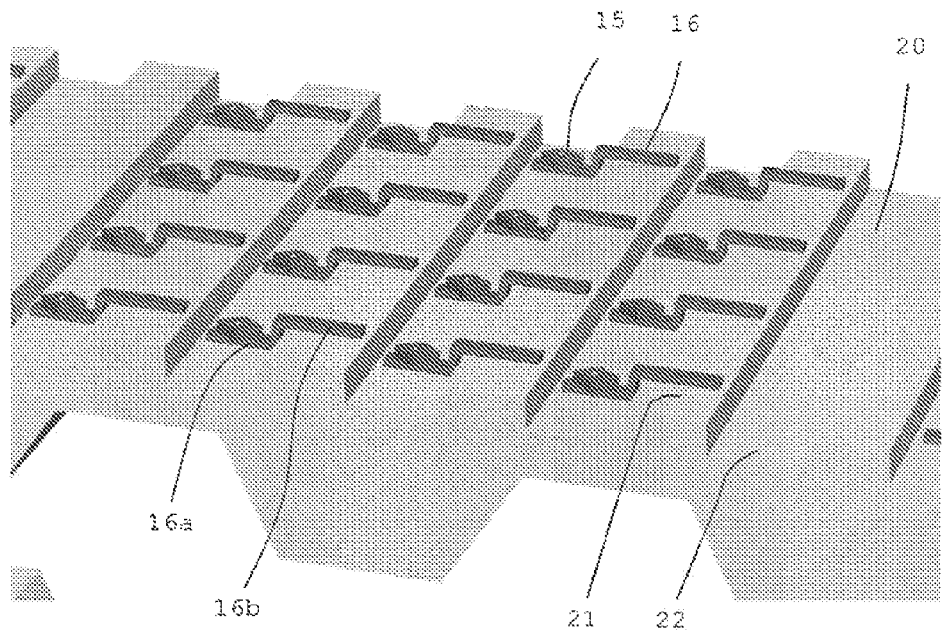

In a second step of the third manufacturing process, which is illustrated in FIG. 19, a number of dies 15 is provided, wherein the bottom side of a die 15 is connected to the lower portion 16a of each collector strip section 16.

Figure 20:
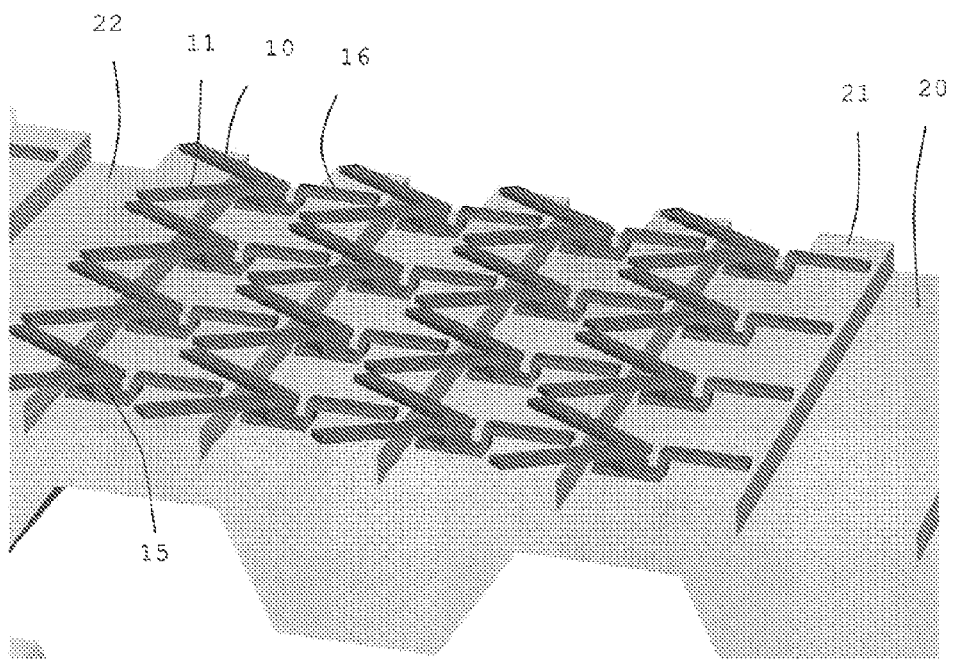

In a third step of the third manufacturing process, which is illustrated in FIG. 20, a number of electrically conductive strip sections 10, 11 which serve for forming the base leads 10 and the emitter leads 11 of the microelectronic package 2 to be manufactured is provided. Two strip sections 10, 11 are connected to each assembly of a collector strip section 16 and a die 15, wherein the strip sections 10, 11 are connected to the top side of the die 15. In the shown example, the depth of the grooves 22 of the caterpillar track 20 is practically equal to a total height of the lower portion 16a of the collector strip section 16 and the die 15 arranged on this portion 16a, so that the base strip sections 10 and the emitter strip sections 11 are supported by the supporting surface 21 which is present between the grooves 22 when they are connected to the top side of the die 15.

In respect of the connections which are established in the second step and the third step, it is noted that these connections may be established in any suitable way, as has already been noted, wherein techniques like wafer back coating and eutectic bonding may be applied.

Figure 21:
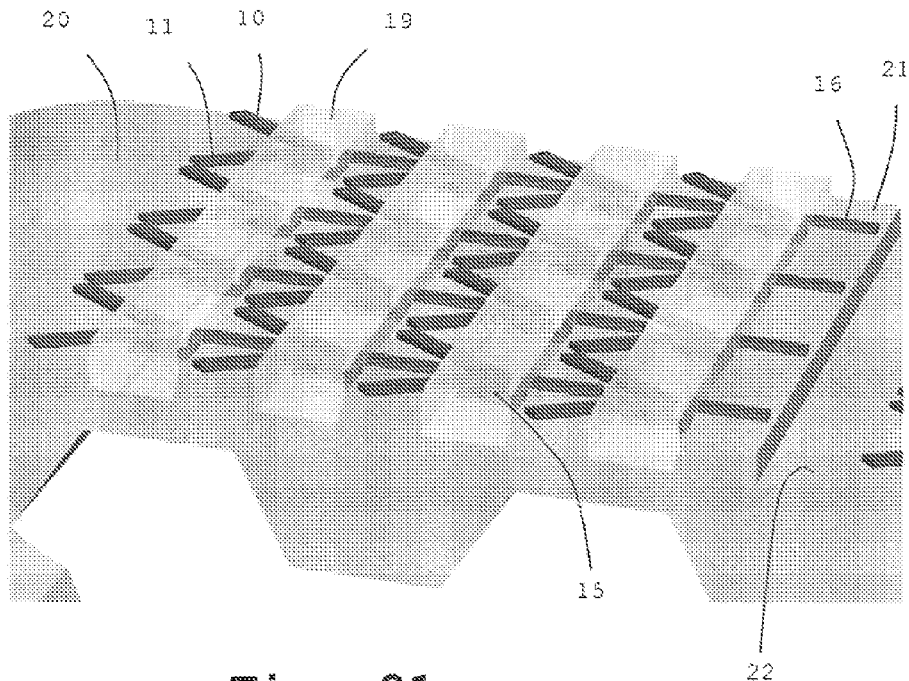

In a fourth step of the third manufacturing process, which is illustrated in FIG. 21, electrically insulating material is applied for the purpose of forming encapsulating members 17, wherein each encapsulating member 17 serves for accommodating a die 15 and portions of the base strip section 10, the emitter strip section 11 and the collector strip section 16 connected to the die 15. The encapsulating members 17 may be made of any suitable material, for example an epoxy material, which may be applied in any suitable way, for example by carrying out a conventional solid bar molding process, in which a number of encapsulating members 17 are formed as portions of a single bar 19. The formation of a bar 19 of encapsulating material is shown in FIG. 21, wherein, for sake of clarity, the bar 19 is shown as being transparent. As has already been noted with respect to the second manufacturing process, it is not necessary to form bars 19 of encapsulating material, and it is just as well possible to form individual encapsulating members 17.

Figure 22:
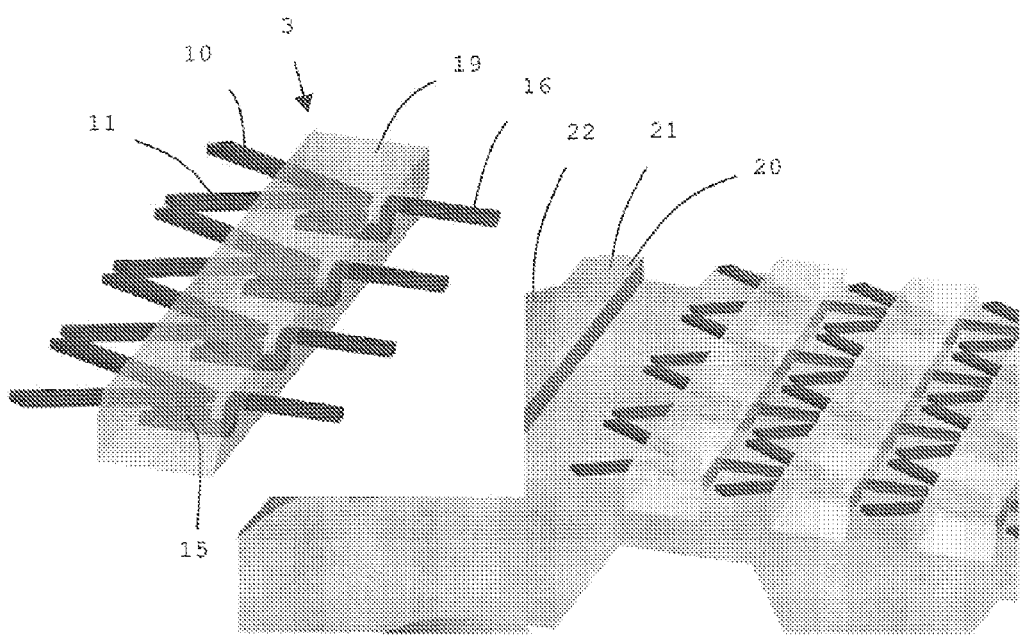

In a fifth step of the third manufacturing process, which is illustrated in FIG. 22, the microelectronic packages 3 which are present in a groove 22 of the caterpillar track 20 and which are interconnected through a bar 19 of encapsulating material are removed from the track 20 when the groove 22 opens up a little as a result of reaching one of the wheels and being bent to some extent. Preferably, the caterpillar track 20 is made of a flexible material such as rubber. On the basis of the fact that the space provided by the grooves 22 decreases somewhat when a portion of the caterpillar track 20 moves in a direction from one wheel to another wheel, it is preferred to insert the collector strip sections 16 in the grooves 22 of a bent track portion at the first wheel, after which the collector strip sections 16 may be clamped in the caterpillar track 20 when the bent track portion becomes a straight track portion. Additionally, for the purpose of keeping the various components of the microelectronic package in the process of formation in a proper position, an adhesive may be applied to the caterpillar track 20.

Figure 23:
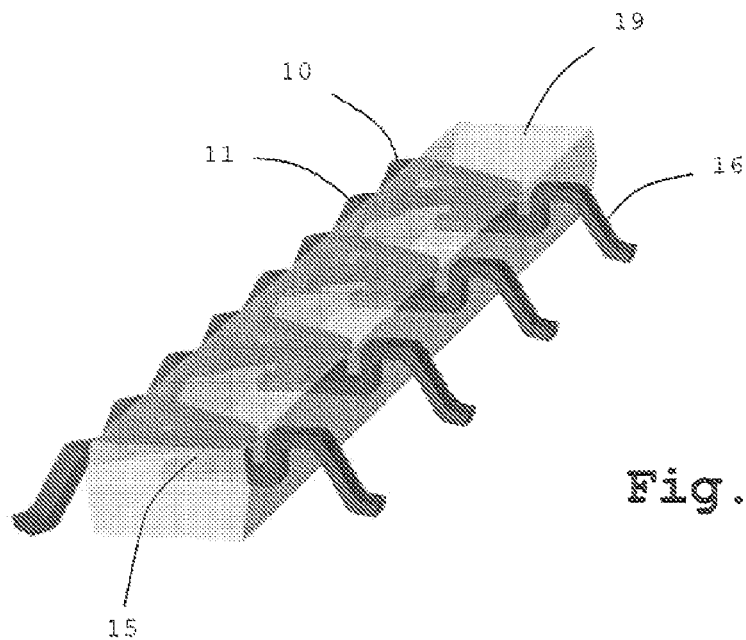

In a sixth step of the third manufacturing process, which is illustrated in FIG. 23, the portions of the strip sections 10, 11, 16 which are extending outside of the encapsulating member 17 are bent such as to allow for connection at a single level by putting ends of the strip sections 10, 11, 16 in a single imaginary plane.

Figure 24:
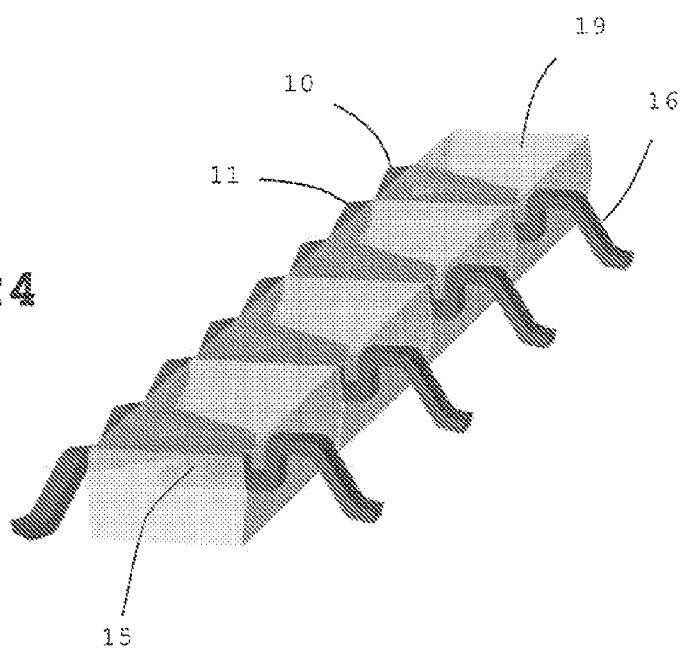
Figure 25:
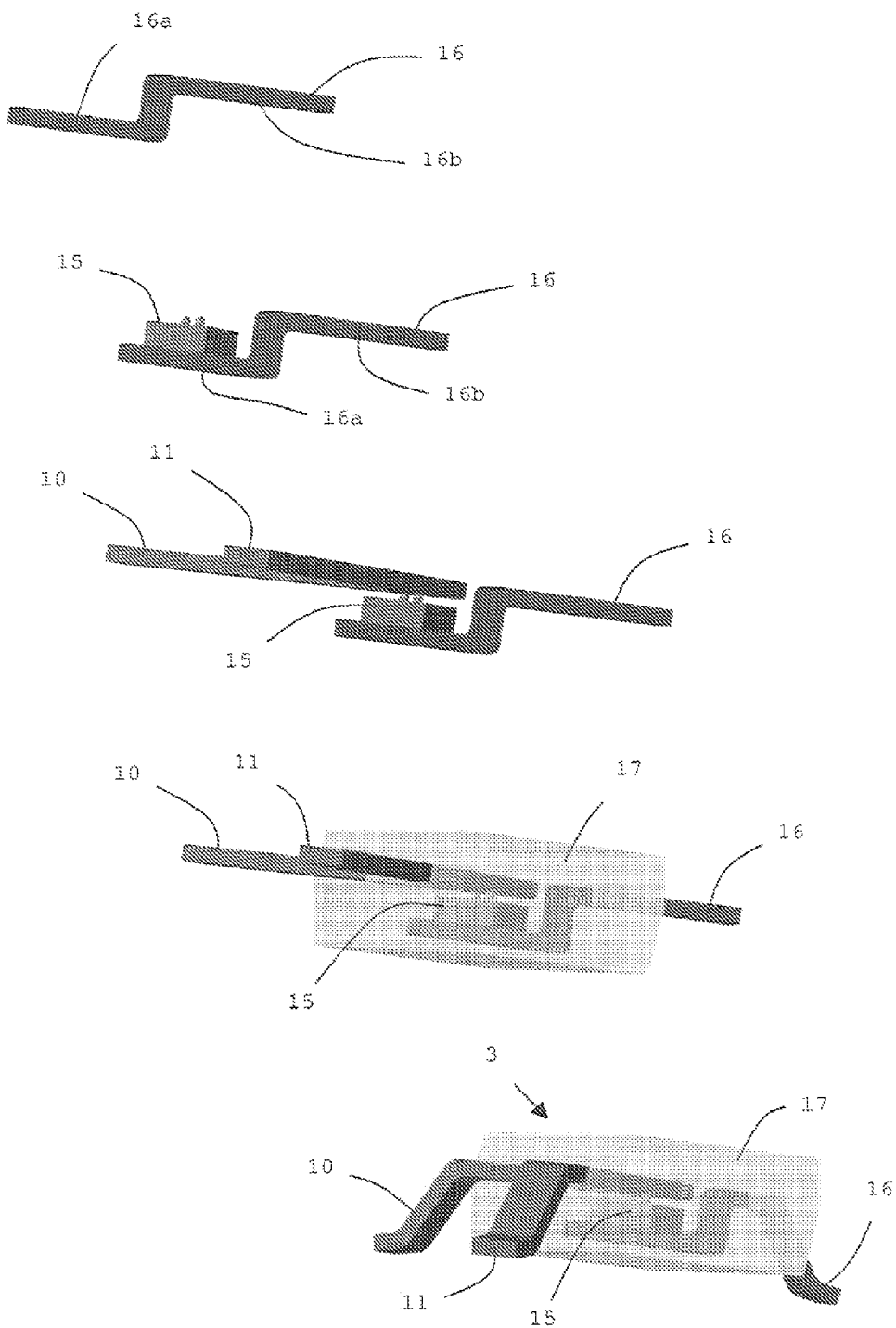
FIG. 25 illustrates successive steps of the formation of the microelectronic package when the third process of manufacturing a microelectronic package according to the present invention is applied.
Figure 26:
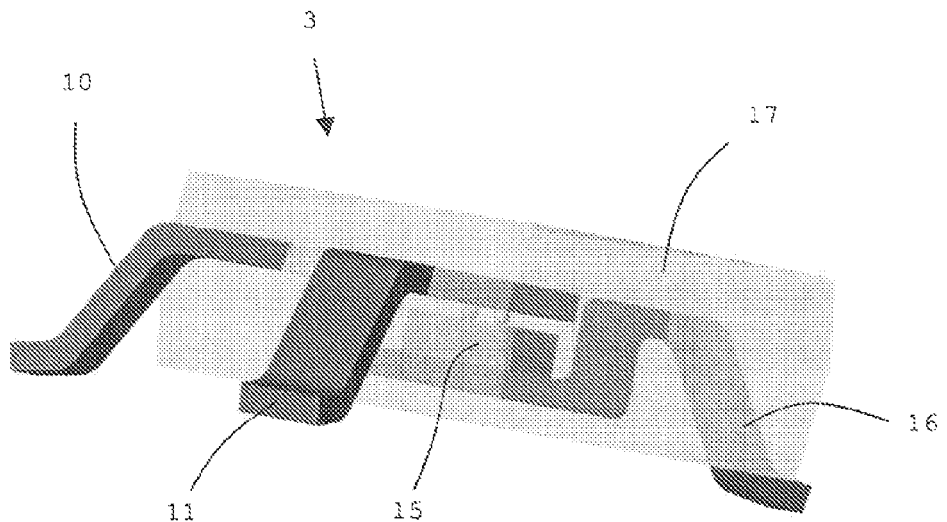
FIGS. 26 and 27 diagrammatically show two different views of a microelectronic package which is realized by performing the third manufacturing process, wherein, for sake of clarity, an encapsulating member of the package is shown as being transparent.
Figure 27:
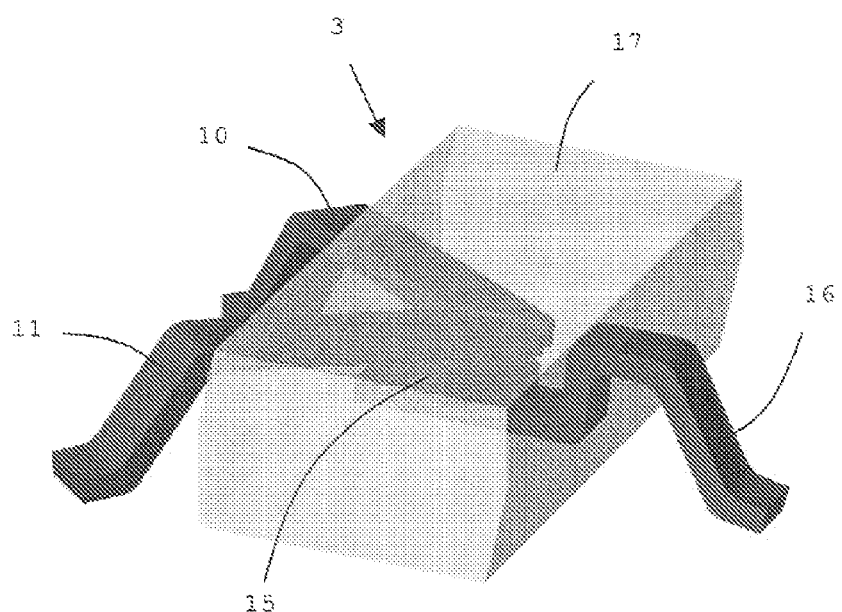

In a seventh step of the third manufacturing process, which is illustrated in FIG. 24, the bar 19 of encapsulating material is cut through, and the individual microelectronic packages 3 are separated. After this seventh step of the third manufacturing process has been performed, the third microelectronic package 3 as shown in FIGS. 26 and 27 is ready. For sake of clarity, the various steps of the formation of the third microelectronic package 3 are illustrated in FIG. 25, which are successively the following steps: providing a bent collector strip section 16 having two portions 16a, 16b which are extending at different levels; providing a die 15 and connecting the bottom side of the die 15 to a lower portion 16a of the collector strip section 16, at a position between the levels of the portions 16a, 16b of this strip section 16; providing a base strip section 10 and an emitter strip section 11 and connecting these strip sections 10, 11 to the top side of the die 15; forming an encapsulating member 17; and bending the portions of the strip sections 10, 11, 16 which are extending outside of the encapsulating member 17.

Preferably, the various steps of the above-described third process of manufacturing a microelectronic package 3 are simultaneously performed on batches comprising a predetermined number of microelectronic packages 3 in the process of formation at different positions in the longitudinal direction of an upper portion of the caterpillar track 20, wherein a number of stations adapted to perform the steps may be arranged alongside the track 20.

It is noted that the third microelectronic package 3 as shown in FIGS. 26 and 27 is more compact than the second microelectronic package 2 as shown in FIGS. 15 and 16, due to the fact that the die 5 is arranged on the lower portion 16a of the collector strip section 16, at a position between the levels of the two portions 16a, 16b of this strip section 16, instead of on the upper portion 16b of this strip section 16.

Figure 33:
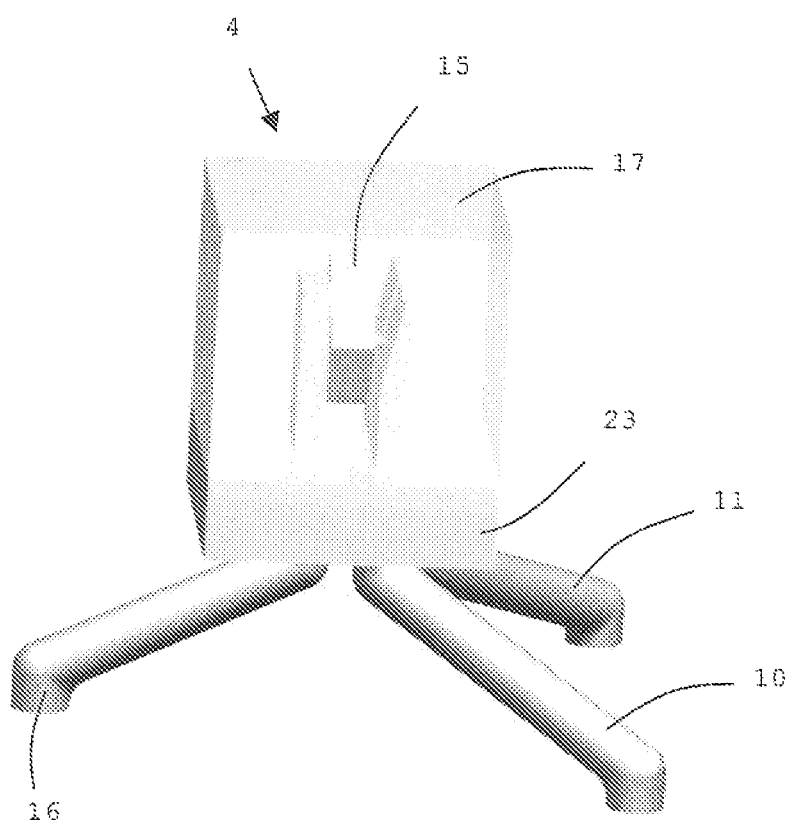
FIG. 33 diagrammatically shows a microelectronic package which is realized by performing the fourth manufacturing process, wherein, for sake of clarity, an encapsulating member of the package is shown as being transparent.

FIGS. 28-31 illustrate successive steps of a fourth process of manufacturing a microelectronic package 4 according to the present invention, which is shown in FIG. 33.

Figure 28:
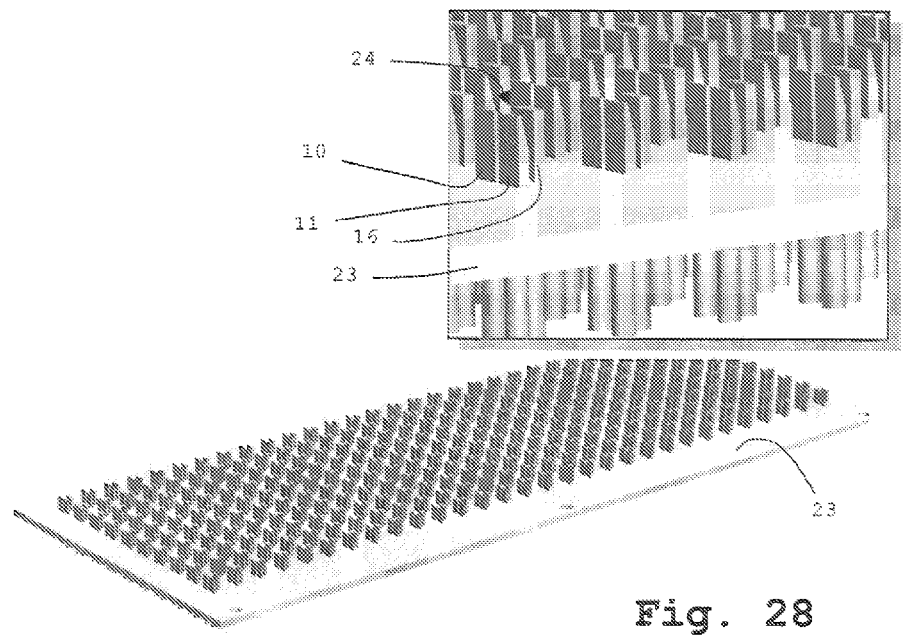
FIGS. 28-31 illustrate successive steps of a fourth process of manufacturing a microelectronic package according to the present invention, wherein a carrier is applied for holding components of the microelectronic package.

In a first step of the fourth manufacturing process, which is illustrated in FIG. 28, a substrate 23 which is made of a thermoplastic material, and which has a plurality of sets of metal wire sections 10, 11, 16 pierced therethrough is provided. The metal wire sections 10, 11, 16 are intended to serve as the base lead 10, the emitter lead 11 and the collector lead 16 of the microelectronic package 4 to be manufactured. At one side of the substrate 23, ends of the wire sections 10, 11, 16 comprise beveled portions, and a space 24 for receiving a die 15 is present between the wire sections 10, 11, 16 at this side of the substrate 23, which, for sake of clarity, will be referred to as top side.

Advantageously, the parts of the wire sections 10, 11, 16 extending at the top side of the substrate 23 are provided with a relatively thin tin plating, while the parts of the wire sections 10, 11, 16 extending at the other side of the substrate 23, which will be referred to as bottom side, are provided with a relatively thick tin plating. For example, a thickness of the tin plating at the top side may be 2 nm, while a thickness of the tin plating at the bottom side may be 7 to 12 nm.

Figure 29:
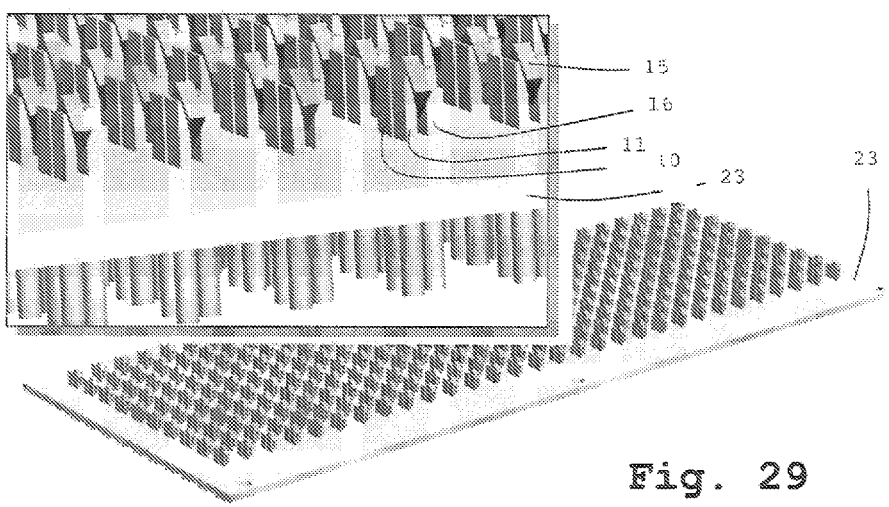

In a second step of the fourth manufacturing process, which is illustrated in FIG. 29, dies 15 are provided, wherein each die 15 is positioned in the space 24 between the wire sections 10, 11, 16 of a set at the top side of the substrate 23. The process of inserting the die 15 is facilitated on the basis of the fact that the tin plating of the wire sections 10, 11, 16 at the top side of the substrate 23 is relatively thin. Subsequently, connections between the die 15 and the wire sections 10, 11, 16 are established in any suitable way, preferably through application of a technique known as reflow soldering, in which solder paste is used, which is made to reflow under the influence of heat, wherein a strong metallurgical bond is obtained after the solder has solidified. It will be clear that when the reflow soldering process is applied, in order for the substrate 23 to remain intact during the reflow soldering process, the thermoplastic material of the substrate 23 needs to be capable of withstanding the reflow soldering temperature, which may be as high as 270° C.

Figure 30:
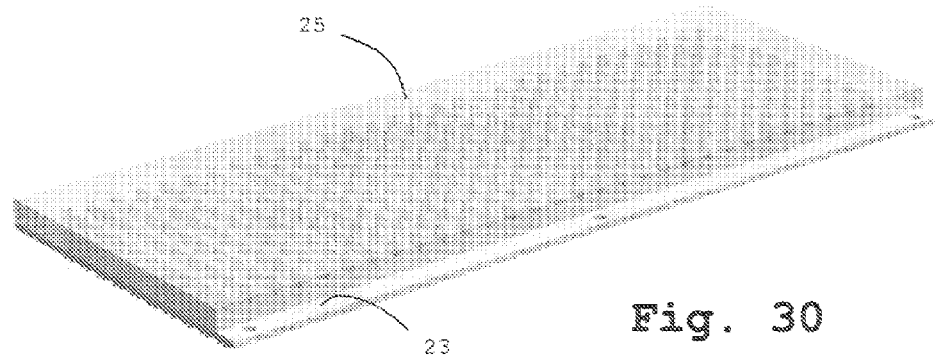

In a third step of the fourth manufacturing process, which is illustrated in FIG. 30, a layer 25 of electrically insulating material is applied to the top side of the substrate 23, wherein the parts of the wire sections 10, 11, 16 extending at this side of the substrate 23 and the die 15 arranged therebetween are encapsulated in the material. For sake of clarity, in FIG. 30, the layer 25 is shown as being transparent.

It is noted that it is not necessary to apply a continuous layer 25 of encapsulating material, and that it is just as well possible to form individual encapsulating members 17 by supplying individual portions of material. However, in general, it is preferred to apply the layer 25 of material as has been described, in view of the fact that it is much easier to do so.

Figure 31:
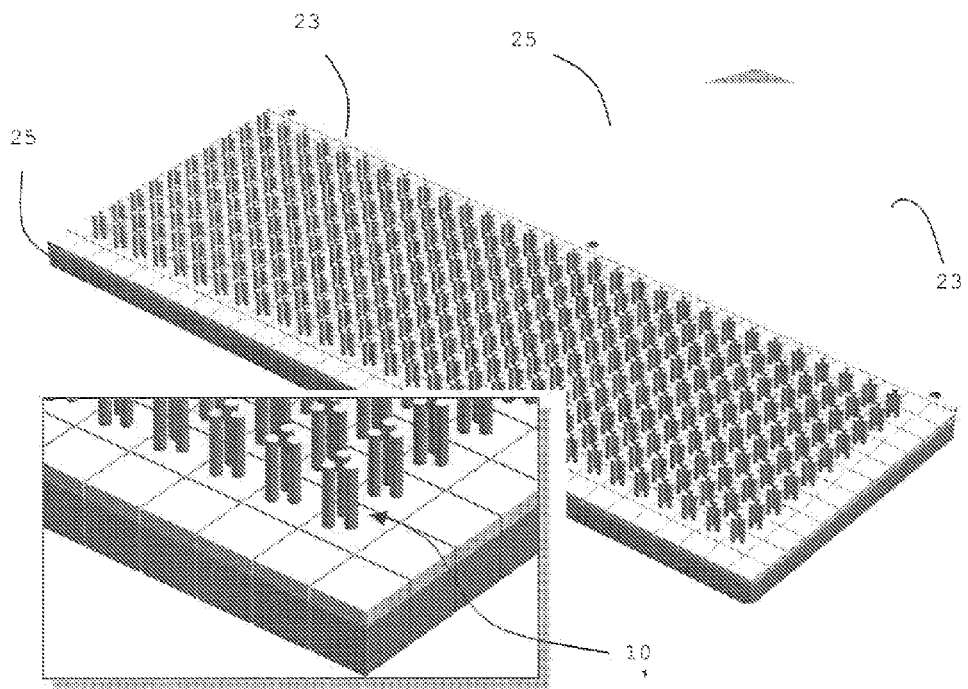

In a fourth step of the fourth manufacturing process, which is illustrated in FIG. 31, the individual microelectronic packages 4 are obtained by dividing the intermediate product which is obtained in the above-described third step in smaller pieces, namely pieces comprising a single set of a base wire section 10, an emitter wire section 11 and a collector wire section 16, a die 15, a portion of the substrate 23 and a portion 17 of the layer 25 of encapsulating material. In the process, any suitable technique may be applied, for example sawing. It is noted that if so desired, the substrate 23 may be removed at a suitable stage of the manufacturing process, i.e. after the connections between the die 15 and the wire sections 10, 11, 16 have been established. If this is done, indeed, the obtained microelectronic packages 4 will not comprise a portion of the substrate 23.

Figure 32:
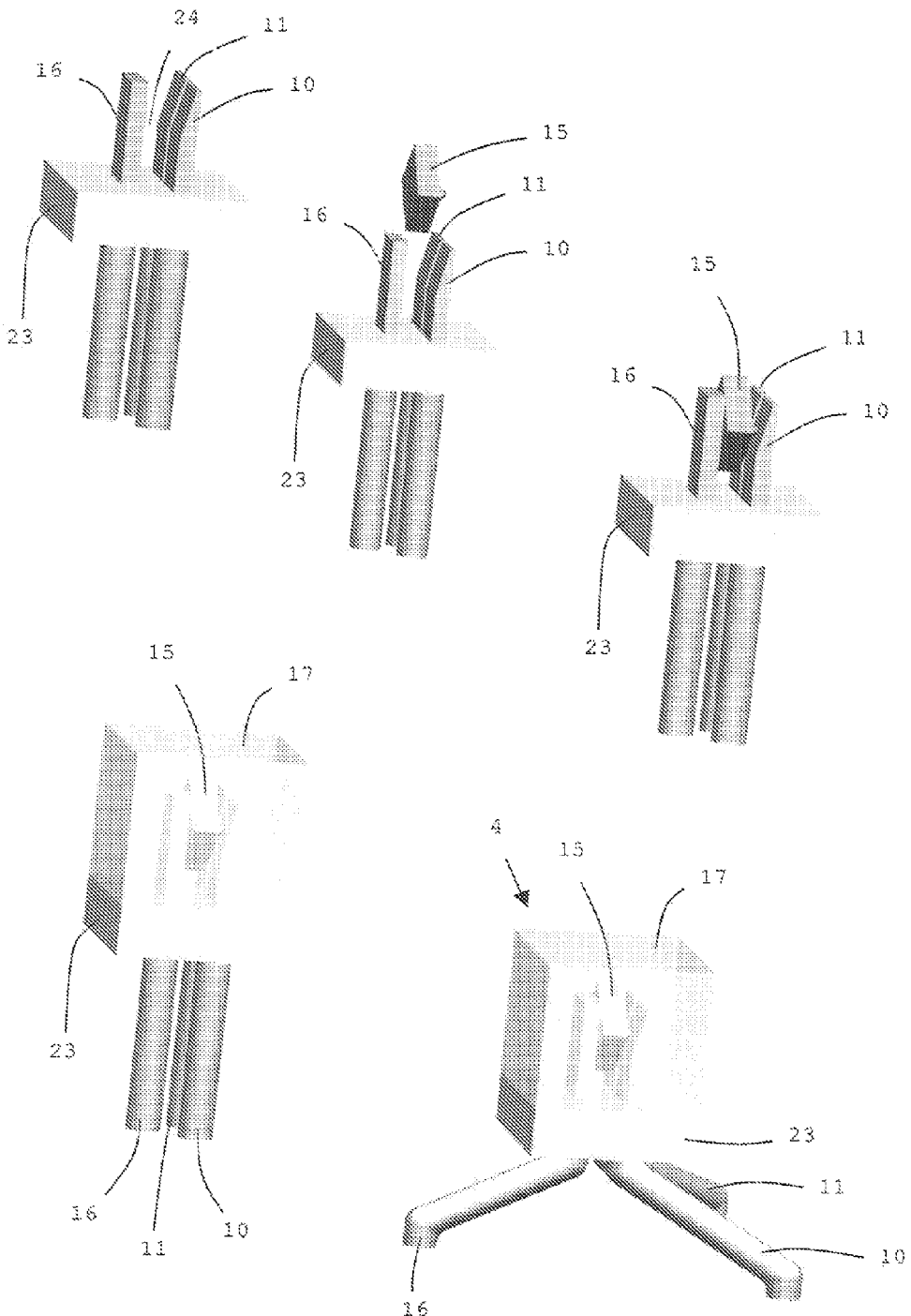
FIG. 32 illustrates successive steps of the formation of the microelectronic package when the fourth process of manufacturing a microelectronic package according to the present invention is applied.

In a fifth step of the fourth manufacturing process, the free parts of the wire sections 10, 11, 16 may be bent such as to obtain a desired configuration of these parts. This is illustrated in FIG. 32 which shows the various steps of the formation of the fourth microelectronic package 4, which are successively the following steps: providing a set of wire sections 10, 11, 16 which are held by a substrate 23 and which are extending through this substrate 23; providing a die 15, inserting the die 15 in a space 24 between parts of the wire sections 10, 11, 16 which are present at a top side of the substrate 23; establishing connections between the die 15 and the wire sections 10, 11, 16 through a reflow soldering process; applying material to the top side of the substrate 23 for encapsulating the parts of the wire sections 10, 11, 16 which are present at this side of the substrate 23 and the die 15 arranged therebetween; and bending the parts of the wire sections 10, 11, 16 which are present at a bottom side of the substrate 23. The latter parts of the wire sections 10, 11, 16 are intended to be connected to another device such as a printed circuit board, wherein soldering to such a device is enabled on the basis of the tin plating provided on these parts.

It will be clear to a person skilled in the art that the scope of the present invention is not limited to the examples discussed in the foregoing, but that several amendments and modifications thereof are possible without deviating from the scope of the present invention as defined in the attached claims. While the present invention has been illustrated and described in detail in the Figures and the description, such an illustration and description are to be considered illustrative or exemplary only, and not restrictive. The present invention is not limited to the disclosed embodiments.

Despite of the fact that all of the above-described examples relate to packages 1, 2, 3, 4 having three leads 10, 11, 16, it is also possible that only two electrically conductive members such as metal wires or strips are used. This may be the case when the die 15 comprises a diode. Manufacturing packages having more than three leads 10, 11, 16 is also feasible within the scope of the present invention. Furthermore, it is noted that the leads 10, 11, 16 of the packages 1, 2, 3, 4 may be bent in such a way that the free ends of the leads 10, 11, 16 fit on a conventional device such as a printed circuit board to which the packages 1, 2, 3, 4 are to be connected.

Variations to the disclosed embodiments can be understood and effected by a person skilled in the art in practicing the claimed invention, from a study of the Figures, the description and the attached claims. In the claims, the word "comprising" does not exclude other steps or elements, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope of the present invention.

In the foregoing, a method for manufacturing a microelectronic package 1, 2, 3, 4 has been disclosed, which comprises the steps of providing at least two members 10, 11, 16 comprising electrically conductive material; providing a microelectronic device 15; placing the electrically conductive members 10, 11, 16 and the microelectronic device 15 in predetermined positions with respect to each other, and establishing electrical connections between each of the electrically conductive members 10, 11, 16 and the microelectronic device 15; and providing a non-conductive material for encapsulating the microelectronic device 15 and a portion of the electrically conductive members 10, 11, 16 connected thereto.

The electrically conductive members 10, 11, 16 are intended to function as leads of the microelectronic package 1, 2, 3, 4, i.e. components which are used for realizing contact of the microelectronic device 15 arranged inside the package 1, 2, 3, 4 to the external world. An important advantage of the method having steps as mentioned is that the leads as such are provided, wherein it is not necessary to provide a conventional lead frame which, among other things, has the disadvantage of causing considerable waste of material during its manufacturing process.

Furthermore, the method offers the possibility of connecting the various electrically conductive members 10, 11, 16 to a proper side of the microelectronic device 15, so that the application of a relatively complicated connecting method such as wire bonding may be omitted.

The invention claimed is:

1. Method for manufacturing a microelectronic package comprising:
    manufacturing an array of microelectronic packages by providing a plurality of members comprising electrically conductive material;
    providing microelectronic devices,
    forming assemblies of at least one electrically conductive member and a microelectronic device by placing the microelectronic device in a predetermined position with respect to the electrically conductive member, and
    establishing an electrical connection between the microelectronic device and the electrically conductive member;
    providing a plurality of electrically conductive members,
    placing at least one electrically conductive member in a predetermined position with respect to each one of the assemblies of at least one electrically conductive member and a microelectronic device which have already been formed, and
    establishing electrical connections between the electrically conductive members and the microelectronic devices;
    providing a non-conductive material for encapsulating the microelectronic devices and a portion of the electrically conductive members connected thereto; and
    dividing the array of microelectronic packages into individual microelectronic packages;
    wherein a carrier is used for the purpose of supporting at least the electrically conductive members to which the microelectronic devices are first connected; and
    wherein the carrier comprises a caterpillar track having a supporting surface which is provided with a plurality of grooves which are adapted to receive at least a portion of the electrically conductive members.

2. The method according to claim 1,
    wherein a caterpillar track which is shaped as a closed loop and which is supported by at least two wheels is used,
    wherein at least one of the wheels is driven such as to rotate and make the track move,
    wherein each microelectronic package is assembled on a portion of the track which is moving between the two wheels, and
    wherein each microelectronic package is removed from the track when the portion of the track reaches one of the wheels and is made to follow a circumference of this wheel.

* * * * *